(12) United States Patent
Davidson

(10) Patent No.: US 6,225,821 B1
(45) Date of Patent: May 1, 2001

(54) PACKAGE MIGRATION FOR RELATED PROGRAMMABLE LOGIC DEVICES

(75) Inventor: Allan T. Davidson, San Jose, CA (US)

(73) Assignee: Lattice Semiconductor Corporation, DE (US)

( * ) Notice: Subject to any disclaimer, the term of this patent is extended or adjusted under 35 U.S.C. 154(b) by 0 days.

(21) Appl. No.: 09/080,906

(22) Filed: May 18, 1998

(51) Int. Cl.$^7$ .................. H03K 19/177; H01L 25/00; H05K 7/00

(52) U.S. Cl. .................. 326/41; 326/101; 361/729; 327/565

(58) Field of Search .................. 326/39–41, 101; 327/564, 565; 361/729, 735

(56) References Cited

U.S. PATENT DOCUMENTS

| | | | |
|---|---|---|---|
| 4,866,508 | * 9/1989 | Eichelberger et al. | 326/41 |
| 4,871,930 | * 10/1989 | Wong et al. | 326/39 |
| 5,512,765 | * 4/1996 | Gaverick | 257/202 |
| 5,523,705 | * 6/1996 | Steele | 326/39 |
| 5,723,906 | * 3/1998 | Rush | 257/723 |

* cited by examiner

*Primary Examiner*—Michael Tokar
*Assistant Examiner*—James H. Cho
(74) *Attorney, Agent, or Firm*—Skjerven, Morrill, et al.

(57) ABSTRACT

A family of related programmable logic devices is provided. The family includes a first programmable logic device having n number of logic modules. The first programmable logic device is incorporated into a first package, with the n number of logic modules bonded out to the first package. A second programmable logic device has a number of logic modules greater than n. The second programmable logic device is incorporated into a second package of substantially the same size as the first package and having an identical pin assignment, with only n number of the logic modules of the second programmable logic device bonded out to the second package.

19 Claims, 2 Drawing Sheets

PACKAGE MIGRATION FOR RELATED PROGRAMMABLE LOGIC DEVICES

TECHNICAL FIELD OF THE INVENTION

The present invention relates generally to semiconductor integrated circuits, and more particularly, to package migration for related programmable logic devices.

BACKGROUND OF THE INVENTION

A programmable logic device (PLD) is a standard product which can be purchased by systems manufacturers in a "blank" state and, thereafter, custom-configured into a virtually unlimited number of specific logic functions by programming the device. A programmable logic device typically comprises a numbers of pads or cells which can be bonded out to the pins of a package, thereby providing connections between logic circuitry within the device and external elements. Different cells support different connections. That is, some cells are required for the input or output of information, other cells are required for power, and yet other cells are required for grounding.

Programmable logic devices are often developed as "families" of related devices. The different devices in a family provide the same kind of logical functionality, but in varying amounts. For example, all devices in a given family may be operable to compute complex equations; one device, however, may be capable of only computing X number of equations in a given time, whereas another device may be capable of computing 2X number of equations in the same time. Generally, the physical size of a particular device within a given family is directly related to the amount of logical functionality provided by that device. In other words, a larger semiconducting die is required to implement a device which provides more functionality (e.g., one which can solve more equations in a given amount of time).

Because of their programmable nature, programmable logic devices offer great flexibility. Accordingly, a circuit board incorporating such a logic device can be designed independently from the device, thereby allowing development of the board to proceed simultaneously with the development of the programmable logic device. Furthermore, different devices of a programmable logic device family can be "migrated" into packages of the same size so that a system builder can design a circuit board for a particular pin assignment or "footprint," and then choose from any device of such family according to the amount of logical functionality required.

According to previous techniques, the migration of related devices into packages of the same size with identical pin assignments is accomplished as follows. A pattern is created for the different cells used to provide input/output, power, and grounding. For example, a pattern may consist of eight cells for input/output (I/O), one cell for power, and one cell for grounding. This pattern can be repeated multiple times across each edge of a programmable logic device. In a family of related devices, to ensure an even distribution of power, each device has twice the number of repetitions of a cell pattern as the next smaller device. That is, if the smallest device in the family has n repetitions of a pattern, larger devices in the family will have 2n, 4n, 8n, 16n, etc., repetitions of the same pattern. Larger devices in a family are migrated to the same size package as a smaller device of the family by bonding out only a portion of the repeated patterns. For example, if one device in a family has n repetitions of a pattern, and the next larger device has 2n repetitions of the same pattern, the larger device can be migrated into a package for the smaller device by bonding out only every other cell pattern. This technique is commonly referred to as "interleaving." Interleaving is required under previous techniques to provide a uniform power distribution throughout larger devices in the family. If the cell patterns are not interleaved, then a particular portion of the logic circuitry will be denied power such that the section is rendered inoperative. In such case, that section of logic circuitry cannot be used, and the logical functionality of the device is reduced by a proportionate amount.

In light of the above, previous techniques are problematic for numerous reasons. For example, related devices in a family are not scalable in small increments, but rather scalable only in powers of "2." Consequently, a system builder may not be given a sufficient choice of devices from which to select a device that is most suitable for the builder's needs. Furthermore, interleaving of cells is almost impossible when the number of cells on a larger device is not an integer multiple of a smaller device in the same family. Accordingly, not every device in a family can be migrated into a package of a particular size having a particular pin assignment. In addition, due to constraints imposed by power distribution, all devices in a family must be designed at one time.

SUMMARY

The disadvantages and problems associated with previously developed programmable logic devices have been substantially reduced or eliminated using the present invention.

In accordance with an embodiment of the present invention, a programmable logic device includes a plurality of logic modules. A global plane, coupled to each of the plurality of logic modules, has an array of cells which are bonded out for supplying power to and grounding for the programmable logic device. The global plane distributes the supplied power to the plurality of logic modules.

In accordance with another embodiment of the present invention, a family of related programmable logic devices includes a first programmable logic device having n number of logic modules. The first programmable logic device is incorporated into a first package, with the n number of logic modules bonded out to the first package. A second programmable logic device has a number of logic modules greater than n. The second programmable logic device is incorporated into a second package of substantially the same size as the first package and having an identical pin assignment, with only n number of the logic modules of the second programmable logic device bonded out to the second package.

Important technical advantages of the present invention include providing an architecture for a programmable logic device. This architecture comprises a number of logic modules connected by a global plane. Each of these logic modules provides a given amount of logical functionality and can operate independently of the other logic modules. Each logic module includes its own cells for the input and output of information, voltage, and grounding. The global plane routes information and distributes power throughout the device. Like the logic modules, the global plane includes cells for input/output, power, and grounding. With this architecture, an entire family of related devices offering a wide spectrum of logical functionality can be rapidly developed by merely implementing programmable logic devices with more or less logic modules. This allows the amount of logical functionality to be incrementally increased between devices in a family. Furthermore, each of the devices in a family can be readily migrated into similarly sized packages with identical pin assignments by bonding out the cells in a given number of logic modules. The logic modules which are not bonded out may receive power from the global plane, and thus are rendered operable. Accordingly, interleaving is not necessary.

Other important technical advantages are readily apparent to one skilled in the art from the following figures, descriptions, and claims.

BRIEF DESCRIPTION OF THE DRAWINGS

For more complete understanding of the present invention and for further features and advantages, reference is now made to the following description taken in conjunction with the accompanying drawings, in which.

DETAILED DESCRIPTION OF THE PREFERRED EMBODIMENTS

Figure 1:
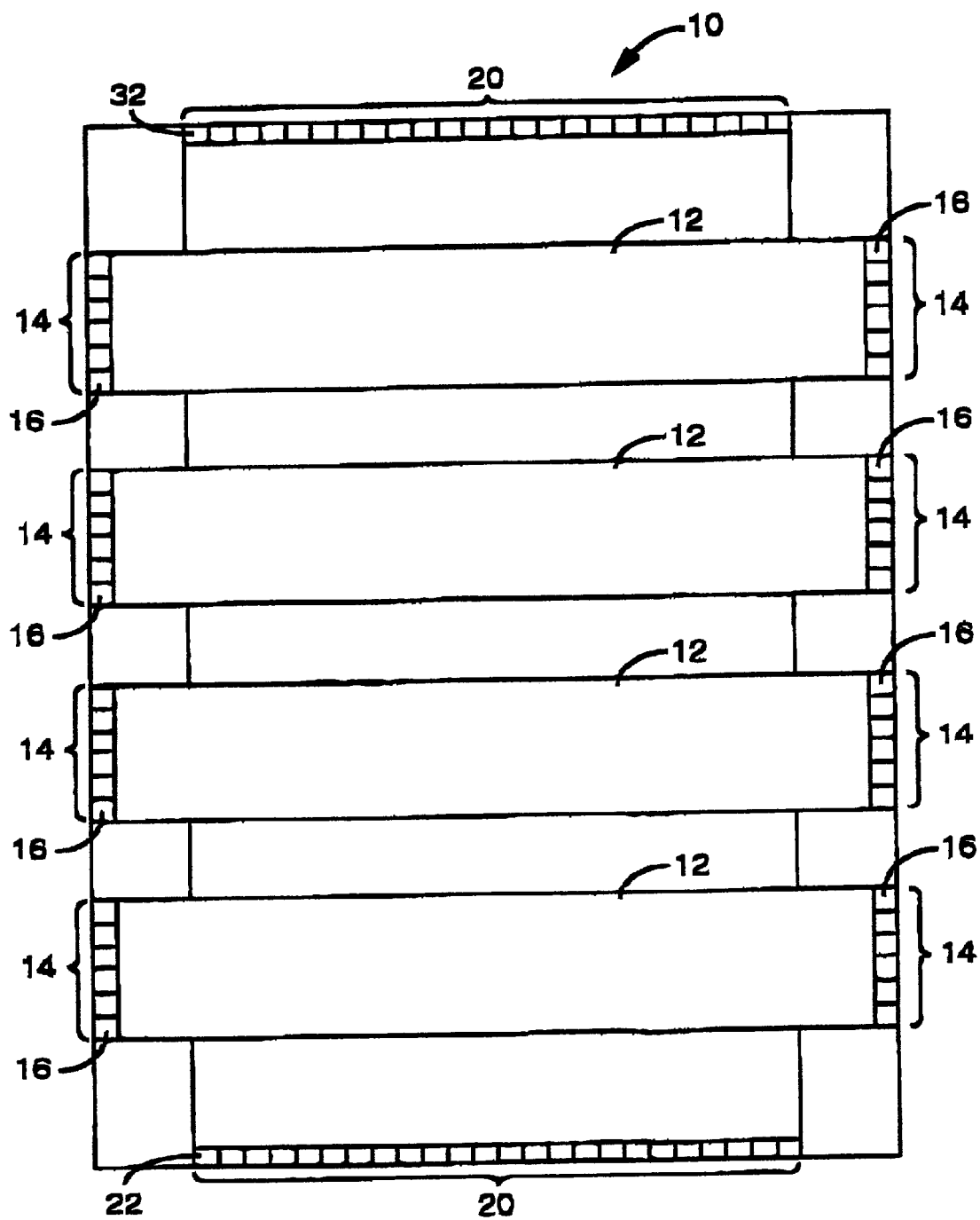
FIG. 1 illustrates an architecture for a programmable logic device, in accordance with an embodiment of the present invention.
Figure 2:
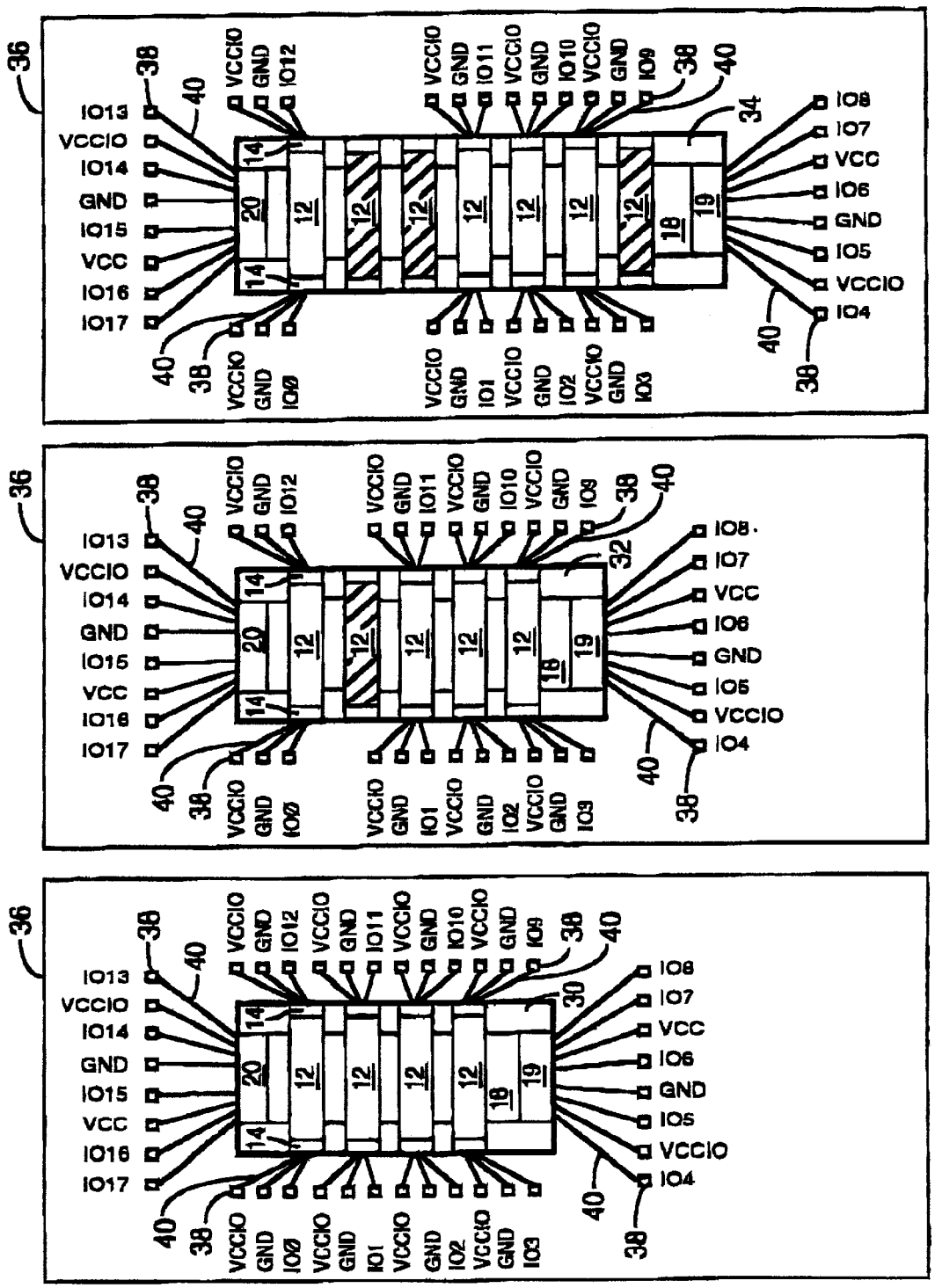
FIG. 2 illustrates a number of different logic devices incorporated into packages of the same size with identical pin assignments, in accordance with the present invention.

The preferred embodiments of the present invention and their advantages are best understood by referring to FIGS. 1 and 2 of the drawings. Like numerals are used for like and corresponding parts of the various drawings.

FIG. 1 illustrates an architecture for an exemplary programmable logic device 10, in accordance with an embodiment of the present invention. This architecture for logic device 10 includes a number of logic modules 12. Each logic module 12 comprises logic circuitry (not shown), such as NAND gates, NOR gates, inverters, and the like, which are generally understood and well-known by those skilled in the art. This logic circuitry can perform various operations upon bits of information received, stored, or generated within programmable logic device 10. Each logic module 12 may provide a given amount of logical functionality. Some of logic modules 12 can be substantially the same, thus providing similar logical functionality. Other logic modules 12 can differ to provide varied logical functionality. Each logic module 12 may operate independently of the other logic modules 12.

One or more arrays 14 may be provided for each logic module 12. As shown, each logic module 12 includes two arrays 14, with one array located at each end. It should be understood, however, that arrays 14 can be located at any suitable location on the logic modules 12. Each array 14 may comprise one or more cells 16 which can be bonded out to connect or couple the respective logic module 12 to external elements, such as a power source, ground, or other electrical devices. For clarity in FIG. 1, reference numerals are provided for only one cell 16 within each array 14. As used herein, the terms "connected," "coupled," or any variant thereof, means any connection or coupling, either direct or indirect, between two or more elements. The bonding of cells 16 can be achieved or supported by I/O pins (not shown) on programmable logic device 10. The type of I/O pins used for programmable logic device 10 depends on the type of packaging used for the device. For example, in a surface mount package, the I/O pins may be leads extending from a lead frame, whereas in a ball grid array package, the I/O pins would be solder connections on the bottom surface of the package. Other standard packaging and pin-out techniques can also be used. The coupling via cells 16 allows each logic module 12 to receive power, grounding, and input signals, and also to send output signals. As such, within each array 14, one or more cells 16 may be provided for each of input/output (I/O), power, and ground. The arrangement of these cells 16 within a particular array 14 can be the same as, or different from, that of other arrays 14.

A global plane 18 connects the plurality of logic modules 12 in programmable logic device 10. Global plane 18 provides programmable communication lines for routing information signals into, out of, and/or throughout device 10, including between and among logic modules 12. For this purpose, global plane 18 can be implemented using any one or a combination of conductive lines, buses, drivers, multiplexers, and the like, which are generally understood and well-known by those skilled in the art. In addition, global plane 18 also functions to distribute or deliver power and grounding to all parts of programmable logic device 10, including each logic module 12.

Global plane 18 includes one or more arrays 20. As depicted, a separate array 20 is located at each end of global plane 18. It should be understood, however, that in general arrays 20 can be located at any suitable location on the global plane. Each array 20 comprises one or more cells 22 which can be bonded out to connect global plane 18 to various external elements. For clarity, reference numerals are provided for only one cell 22 within each array 20. Within each array 20, one or more cells 22 may be provided for each of input/output (I/O), power, and ground. That is, cells 22 provide coupling or connections for informational input/output, grounding, and power. The bonding of cells 22 can be achieved or supported by I/O pins (not shown) on programmable logic device 10. The type of I/O pins used for programmable logic device 10 can be any suitable type, such as leads extending from a lead frame or solder connections to a ball grid array package, depending upon the packaging used for the device. The coupling via cells 22 allows all parts of programmable logic device 10 to receive power, grounding, and input signals, and also to send output signals.

Much of the power consumed by a programmable logic device is used to support the input and output of information signals to and from external elements. Thus, in programmable logic device 10, most of the power received at cells 16 in logic modules 12 can be used primarily to drive the input/output of information to and from the respective modules 12. Although some of the power from cells 16 can be used to drive the logic circuitry in logic modules 12, additional power for the logic circuitry may be supplied via one or more cells 22 of global plane 18.

In an exemplary operation, cells 22 within global plane 18 are bonded out for generally coupling programmable logic device 10 to external elements, such as power sources, ground, or other electrical devices. This bonding allows global plane 18 to receive power, which it then distributes to all parts of programmable logic device 10, including to each logic module 12 for driving the logic circuitry therein. Informational input can also be received at cells 22. Global plane 18 routes this information to logic modules 12 for processing. After information has been processed at one logic module 12, global plane 18 can route the resultant information to one or more other logic modules 12 for additional processing. Alternatively, global plane 18 can output the resultant information to external elements via bonded cells 22.

Furthermore, cells 16 in at least a portion of logic modules 12 can be bonded out as well for coupling to the same or different external devices as global plane 18. This bonding allows the respective logic modules 12 to separately receive power, grounding, and informational input. The power received at these logic modules 12 can be used primarily to drive the input and output of information at cells 16. Any information received at cells 16 can be processed within the respective logic module 12, forwarded to other logic modules via global plane 18, and/or output at cells 16.

Cells 16 in the remaining logic modules 12 are not bonded out. These logic modules 12 are nonetheless operative because their logic circuitry is driven by power distributed via global plane 18. This allows the logic modules 12 with no bonded-out cells 16 to process information originally input at global plane 18 or the bonded-out logic modules 12. As such, the non-bonded logic modules 12 comprise embedded logic which is "hidden" to external devices, but still available for the processing of information within programmable logic device 10.

With the above-described architecture and operation for programmable logic device 10, the present invention allows logical functionality to be increased or decreased in small increments, rather than in powers of "2." Specifically, because each logic module 12 may operate independently and provides a given amount of logical functionality, an entire family of related devices offering a wide spectrum of logical functionality can be rapidly developed by merely implementing programmable logic devices with more or less logic modules 12. The different devices in the family can then be offered in various packages so that a system builder can select the device and package which is most suitable for that builder's application or requirements. With some device/package combinations, not all of the logic modules 12 are bonded out, but such logic modules are still available as buried logic. This is more fully described with reference to FIG. 2.

FIG. 2 illustrates a first programmable logic device 30, a second programmable logic device 32, and a third programmable logic device 34, each implemented within packages 36 having identical pin assignments, in accordance with the present invention. Programmable logic devices 30, 32, and 34 are implemented on semiconducting dies of varying sizes. The edges of such dies are represented by the bold, solid lines in FIG. 2.

Programmable logic devices 30, 32, and 34 can be related devices in the same family. Each programmable logic device 30, 32, and 34 comprises a number of logic modules 12. Each logic module 12 comprises logic circuitry, and two cell arrays 14 located at opposing ends. These logic modules 12 can be substantially the same, thereby providing essentially the same kind of logical functionality throughout devices 30, 32, and 34. The amount of logical functionality provided, however, differs from one device to another because the number of logic modules 12 differs. In particular, as shown, device 30 comprises four logic modules 12; device 32 comprises five logic modules 12, and device 34 comprises seven logic modules 12. Each programmable logic device 30, 32, and 34 also comprises a global plane 18 having cell arrays 20 located at opposing ends. These arrays 20 can be substantially the same for all of the devices.

Cells in arrays 14 and 20 of global plane 18 and at least a portion of the logic modules 12 in each of programmable logic devices 30, 32, and 34 are bonded out to contacts 38 which are part of the package and are located around the edges of the respective semiconducting dies. For clarity in FIG. 2, reference numerals are provided for only a portion of contacts 38. Each contact 38 may correspond to or be associated with a particular pin of the respective package 36 and, as such, is labeled with a corresponding pin identifier (e.g., VCCIO, VCC, GND, IO0, IO1, IO2, etc.). Although one particular pin assignment is illustrated in FIG. 2, it should be understood that the invention is not so limited. Rather, any suitable pin assignment can be utilized. The bonding of the cells in each of devices 30, 32, and 34 with contacts 38 can be made with bonding wires 40. For clarity, reference numerals are used for only a portion of the bonding wires 40. Although not shown, conductors extend from package contacts 38 to package I/O pins on the respective devices. The bonding of global planes 18 and logic modules 12 with contacts 38 enable programmable logic devices 30, 32, and 34 to input/output information, and to receive power and grounding. The received power can be used to drive logic circuitry within logic modules 12 and the transmission of information signals.

Some of the logic modules 12 within the larger devices 32 and 34 are not bonded out via their respective arrays 14. In particular, one logic module 12 of device 32 and three logic modules 12 of device 34 are not so bonded. These logic modules 12 are shaded with cross hatches in FIG. 2. Even though these logic modules 12 are not bonded out, they still receive power and information signals from the respective global planes 18, and thus, are available as buried logic within programmable logic devices 32 and 34.

Note that in the bonding arrangements shown in FIG. 2 and described herein, interleaving (i.e., the skipping of every "nth" I/O pin) is not required because all logic modules 12 can receive power from the respective global planes 12. Furthermore, with these bonding arrangements, programmable logic devices 30, 32, and 34 offer varying amounts of logical functionality in similarly sized packages. More specifically, if it is assumed that each logic module 12 provides one unit of logical functionality, then device 30 provides four units of functionality, device 32 provides five units of functionality, and device 34 provides seven units of functionality.

From the above, it is clear that the present invention affords numerous technical advantages. For example, logical functionality can be provided in small increments (rather than in multiples) depending upon the number of logic modules 12 contained within a programmable logic device. In addition, because no interleaving is required, the migration of different devices in a family into packages of the same size having identical pin assignments is facilitated.

Although the present invention and its advantages have been described in detail, it should be understood that various changes, substitutions, and alterations can be made therein without departing from the spirit and scope of the invention as defined by the appended claims.

What is claimed is:

1. A family of related programmable logic devices, comprising:
   a first programmable logic device having n number of logic modules and incorporated into a first package, the n number of logic modules bonded out to the first package; and
   a second programmable logic device having a number of logic modules greater than n and incorporated into a second package of substantially the same size with an identical pin assignment as the first package, wherein only n number of the logic modules of the second programmable logic device are bonded out to the second package.

2. The family of related programmable logic devices of claim 1, wherein each of the first and second programmable logic devices comprises a global plane for distributing power to the respective logic modules.

3. The family of related programmable logic devices of claim 2, wherein each global plane routes information to and from each of the respective logic modules.

4. The family of related programmable logic devices of claim 2, wherein each global plane has an array of cells which are bonded out for supplying power to and grounding for the respective programmable logic device.

5. The family of related programmable logic devices of claim 1, herein each logic module of the first and second programmable logic devices comprises an array of cells which can be bonded out for supplying power to and grounding for the respective logic module.

6. The family of related programmable logic devices of claim 1, wherein each logic module of the first and second programmable logic devices comprises an array of cells which supports the input and output of information to and from the respective logic module.

7. A programmable logic device comprising:
a plurality of logic modules, each logic module having an array of cells which can be bonded out for supplying power to and grounding for the respective logic module; and
a global plane coupled to each of the plurality of logic modules, the global plane having an array of cells which are bonded out for supplying power to and grounding for the programmable logic device, the global plane distributing the supplied power to the plurality of logic modules.

8. The programmable logic device of claim 7, wherein the global plane is further operable to route information throughout the programmable logic device, including to and from each of the plurality of logic modules.

9. The programmable logic device of claim 7, wherein each logic module operates independently of all other logic modules.

10. The programmable logic device of claim 7, wherein the array of cells in each logic module supports the input and output of information to and from the respective logic module.

11. The programmable logic device of claim 7, wherein:
the arrays of cells in a first portion of the plurality of logic modules are bonded out to contact pads in a package into which the programmable logic device is incorporated; and
the arrays of cells in a second portion of the plurality of logic modules are not bonded out to contact pads in the package.

12. The programmable logic device of claim 7, wherein the array of cells of the global plane supports the input and output of information to and from the programmable logic device.

13. A programmable logic device comprising:
a plurality of logic modules, each logic module having an array of cells which can be bonded out for supplying power to and grounding for the respective logic module, wherein
the arrays of cells in a first portion of the plurality of logic modules are bonded out for supplying power to and grounding for the respective logic modules, and
the arrays of cells in a second portion of the plurality of logic modules are not bonded out; and
a global plane coupled to each of the plurality of logic modules, the global plane having an array of cells which are bonded out for supplying power to and grounding for the programmable logic device, the global plane distributing the supplied power to the plurality of logic modules.

14. The programmable logic device of claim 13, wherein the global plane is further operable to route information throughout the programmable logic device, including to and from each of the plurality of logic modules.

15. The programmable logic device of claim 13, wherein each logic module operates independently of all other logic modules.

16. An integrated circuit, comprising:
a package including a plurality of terminals for sending and receiving signals to and from outside of said package;
a first programmable logic circuit fabricated on a semiconductor substrate attached to said package, said first programmable logic circuit including a plurality of bond pads for sending and receiving logic signals to and from said first programmable logic circuit;
a plurality of bond wires each coupling one of bond pads to one of said terminals of said package; and
a second programmable logic circuit substantially identical to said first programmable logic circuit fabricated on said semiconductor substrate, the corresponding bond pads of said second programmable logic circuit being left unbonded; and
wherein each of said first and second programmable logic circuits includes a bond pad for receiving a first power supply signal having a voltage selected for a state of a logic signal.

17. The integrated circuit as in claim 16, further comprising conductors fabricated on said semiconductor substrate for providing a second power supply signal common to said first and second programmable logic circuit.

18. The integrated circuit as in claim 16, wherein each of said first and second programmable logic circuit comprises a programmable logic array.

19. The integrated circuit as in claim 16, wherein each of said first and second programmable logic circuit comprises programmable interconnect circuits.

* * * * *